(12) United States Patent
Nulty et al.

(10) Patent No.: US 7,685,705 B2
(45) Date of Patent: Mar. 30, 2010

(54) METHOD OF FABRICATING A PROBE CARD

(75) Inventors: James E. Nulty, San Jose, CA (US); James A. Hunter, Campbell, CA (US); Alexander J. Herrera, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 83 days.

(21) Appl. No.: 12/008,483

(22) Filed: Jan. 11, 2008

(65) Prior Publication Data

US 2008/0110019 A1  May 15, 2008

Related U.S. Application Data

(62) Division of application No. 11/084,671, filed on Mar. 18, 2005, now Pat. No. 7,332,921.

(60) Provisional application No. 60/556,556, filed on Mar. 26, 2004.

(51) Int. Cl.
  *H01R 9/00* (2006.01)
  *H05K 3/00* (2006.01)
(52) U.S. Cl. .............. 29/845; 29/842; 29/846; 29/832; 234/754; 439/190
(58) Field of Classification Search ........... 29/830–832, 29/842, 844–846, 874; 324/754, 755, 761, 324/762, 765; 439/66, 190, 482
See application file for complete search history.

(56) References Cited

U.S. PATENT DOCUMENTS

| | | | |
|---|---|---|---|
| 4,232,928 A | * | 11/1980 | Wickersham ............... 439/190 |
| 4,754,316 A | | 6/1988 | Reid |
| 5,061,033 A | | 10/1991 | Richard |
| 5,070,297 A | | 12/1991 | Kwon et al. |
| 5,172,050 A | | 12/1992 | Swapp |
| 5,338,223 A | | 8/1994 | Melatti et al. |
| 5,380,318 A | | 1/1995 | Daikuzono |
| 5,477,160 A | * | 12/1995 | Love ........................ 439/66 |
| 5,555,422 A | | 9/1996 | Nakano |
| 5,600,257 A | | 2/1997 | Leas et al. |
| 5,763,879 A | | 6/1998 | Zimmer et al. |
| 5,807,767 A | | 9/1998 | Stroupe |

(Continued)

FOREIGN PATENT DOCUMENTS

JP     2005233858 A      9/2005

OTHER PUBLICATIONS

U.S. Appl. No. 11/084,671: "Probe Card and Method for Constructing Same," Nulty et al., filed on Mar. 18, 2005; 27 pages.

(Continued)

*Primary Examiner*—Donghai D. Nguyen

(57) ABSTRACT

A probe card for testing dice on a wafer includes a substrate, a number of cantilevers formed on a surface thereof, and a number of probes extending from unsupported ends of the cantilevers. The unsupported ends of the cantilevers project over cavities on the surface of the substrate. The probes have tips to contact pads on the dice under test. The probe card may include a compressive layer above the surface of the substrate with a number of holes through which the probes extend.

9 Claims, 6 Drawing Sheets

U.S. PATENT DOCUMENTS

| | | | |
|---|---|---|---|
| 5,811,982 A * | 9/1998 | Beaman et al. | 324/762 |
| 5,850,148 A | 12/1998 | Nam | |
| 5,926,029 A | 7/1999 | Ference et al. | |
| 5,929,651 A | 7/1999 | Leas et al. | |
| 5,940,965 A | 8/1999 | Uhling et al. | |
| 6,060,891 A | 5/2000 | Hembree et al. | |
| 6,064,213 A | 5/2000 | Khandros et al. | |
| 6,074,904 A | 6/2000 | Spikes | |
| 6,075,373 A | 6/2000 | Iino | |
| 6,084,215 A | 7/2000 | Furuya et al. | |
| 6,130,104 A | 10/2000 | Yamasaka | |
| 6,146,970 A | 11/2000 | Witek et al. | |
| 6,208,155 B1 | 3/2001 | Barabi et al. | |
| 6,208,947 B1 | 3/2001 | Beffa | |
| 6,246,245 B1 | 6/2001 | Akram et al. | |
| 6,246,250 B1 | 6/2001 | Doherty et al. | |
| 6,400,173 B1 | 6/2002 | Shimizu et al. | |
| 6,433,563 B1 | 8/2002 | Maruyama | |
| 6,452,411 B1 | 9/2002 | Miller et al. | |
| 6,469,530 B1 | 10/2002 | Johnson et al. | |
| 6,469,908 B2 | 10/2002 | Patel et al. | |
| 6,483,330 B1 | 11/2002 | Kline | |
| 6,509,213 B2 | 1/2003 | Noble | |
| 6,527,563 B2 | 3/2003 | Clayton | |
| 6,531,335 B1 | 3/2003 | Grigg | |
| 6,551,844 B1 | 4/2003 | Eldridge et al. | |
| 6,559,666 B2 | 5/2003 | Bernier et al. | |
| 6,563,173 B2 | 5/2003 | Bolam et al. | |
| 6,627,484 B1 | 9/2003 | Ang | |
| 6,627,954 B1 | 9/2003 | Seefeldt | |
| 6,661,244 B2 | 12/2003 | McQuade et al. | |
| 6,664,131 B2 | 12/2003 | Jackson | |
| 6,724,204 B2 | 4/2004 | Cho et al. | |
| 6,753,238 B2 | 6/2004 | Kurita | |
| 6,759,858 B2 | 7/2004 | Roggel | |
| 6,759,865 B1 * | 7/2004 | Gu et al. | 324/765 |
| 6,774,395 B1 | 8/2004 | Lin et al. | |
| 6,847,218 B1 * | 1/2005 | Nulty et al. | 324/754 |
| 6,849,928 B2 | 2/2005 | Cha et al. | |
| 6,912,778 B2 | 7/2005 | Ahn et al. | |
| 6,922,069 B2 | 7/2005 | Jun | |
| 7,112,974 B1 | 9/2006 | Jin et al. | |
| 7,112,975 B1 | 9/2006 | Jin et al. | |
| 7,145,225 B2 | 12/2006 | Lee | |
| 7,332,921 B2 | 2/2008 | Nulty et al. | |
| 7,381,630 B2 | 6/2008 | Sawyer | |

OTHER PUBLICATIONS

USPTO Notice of Allowance for U.S. Appl. No. 11/084,671 dated Sep. 27, 2007; 7 pages.
USPTO Non-Final Rejection for U.S. Appl. No. 11/084,671 dated Apr. 24, 2007; 13 pages.
USPTO Non-Final Rejection for U.S. Appl. No. 11/084,671 dated Oct. 10, 2006; 11 pages.
USPTO Non-Final Rejection for U.S. Appl. No. 11/084,671 dated May 3, 2006; 11 pages.
USPTO Requirement for Restriction for U.S. Appl. No. 11/084,671 dated Mar. 20, 2006; 7 pages.
U.S. Appl. No. 10/209,088: "Array of Dice for Testing Integrated Circuits," Gu et al., filed on Jul. 30, 2002; 22 pages.
USPTO Notice of Allowance for U.S. Appl. No. 10/209,088 dated Mar. 8, 2004; 5 pages.
USPTO Final Rejection for U.S. Appl. No. 10/209,088 dated Dec. 30, 2003; 8 pages.
USPTO Non-Final Rejection for U.S. Appl. No. 10/209,088 dated Jul. 9, 2003; 5 pages.
U.S. Appl. No. 10/144,676: "Probe Card with an Adapter Layer for Testing Integrated Circuits," Nulty et al., filed on May 13, 2002; 25 pages.
USPTO Miscellaneous Action for U.S. Appl. No. 10/144,676 dated Dec. 3, 2004; 2 pages.
USPTO Notice of Allowance for U.S. Appl. No. 10/144,676 dated May 28, 2004; 7 pages.
USPTO Final Rejection for U.S. Appl. No. 10/144,676 dated Feb. 19, 2004; 13 pages.
USPTO Non-Final Rejection for U.S. Appl. No. 10/144,676 dated Jul. 10, 2003; 10 pages.
USPTO Miscellaneous Action for U.S. Appl. No. 10/144,676 dated Jun. 14, 2002; 2 pages.
U.S. Appl. No. 10/784,566: "Advanced Probe Card and Method of Fabricating Same," Jin et al., filed on Feb. 23, 2004; 21 pages.
USPTO Notice of Allowance for U.S. Appl. No. 10/784,566 dated May 23, 2006; 5 pages.
USPTO Non-Final Rejection for U.S. Appl. No. 10/784,566 dated Feb. 7, 2006; 5 pages.
USPTO Non-Final Rejection for U.S. Appl. No. 10/784,566 dated Aug. 22, 2005; 8 pages.
USPTO Non-Final Rejection for U.S. Appl. No. 10/784,566 dated Mar. 22, 2005; 8 pages.
U.S. Appl. No. 10/154,089: "Probe for Testing integrated Circuits," Jin et al., filed on May 23, 2002;. 17 pages.
USPTO Notice of Allowance for U.S. Appl. No. 10/154,089 dated May 30, 2006; 6 pages.
USPTO Non-Final Rejection for U.S. Appl. No. 10/154,089 dated Dec. 27, 2005; 8 pages.
USPTO Advisory Action for U.S. Appl. No. 10/154,089 dated Oct. 25, 2005; 3 pages.
USPTO Final Rejection for U.S. Appl. No. 10/154,089 dated Aug. 19, 2005; 9 pages.
USPTO Non-Final Rejection for U.S. Appl. No. 10/154,089 dated Mar. 7, 2005; 7 pages.
International Search Report of the International Searching Authority for International U.S. Appl. No. PCT/US05/09984; Apr. 2005; 1 page.
Written Opinion of the International Searching Authority for International U.S. Appl. No. PCT/US05/09984 mailed Jun. 27, 2006; 5 pages.
International Search Report of the International Searching Authority for International U.S. Appl. No. PCT/US03/14844 mailed Sep. 18, 2003; 3 pages.
Bengtsson et al., "Interface Charge Control of Directly Bonded Silicon Structures," Journal of Applied Physics, vol. 66, pp. 1231-1239; Aug. 1, 1989; 9 pages.

* cited by examiner

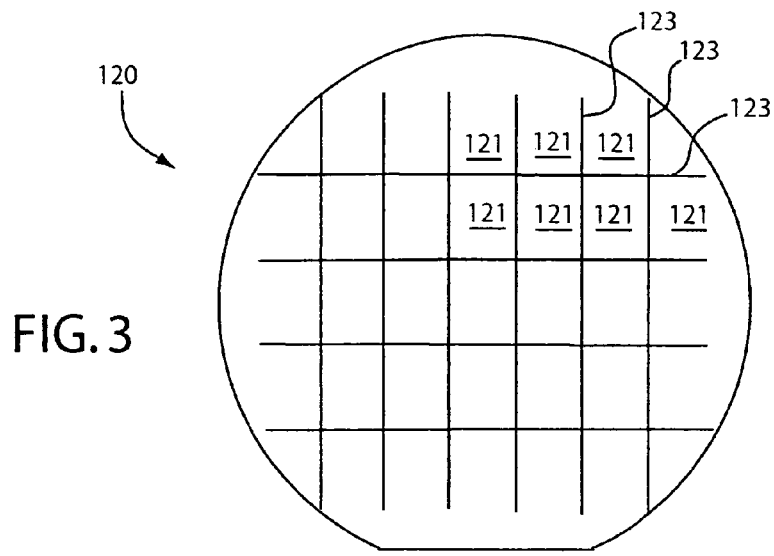
FIG. 3
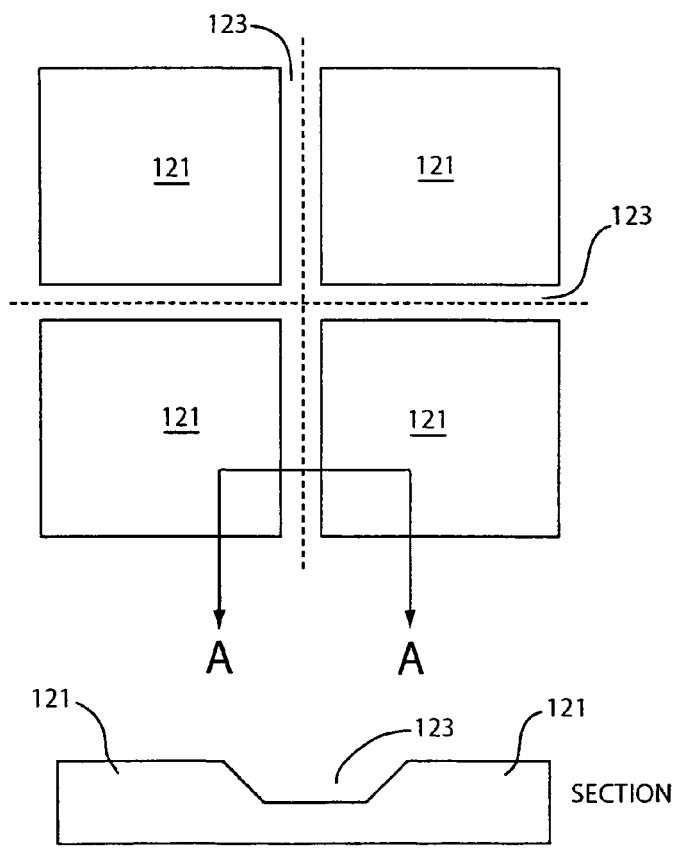
FIG. 4
FIG. 5

METHOD OF FABRICATING A PROBE CARD

CROSS-REFERENCE TO RELATED APPLICATION

This application is a divisional of U.S. application Ser. No. 11/084,671, filed on Mar. 18, 2005, issued as U.S. Pat. No. 7,332,921, which claims the benefit of U.S. Provisional Application No. 60/556,556, filed on Mar. 26, 2004. Both of the aforementioned disclosures are incorporated herein by reference in their entirety.

BACKGROUND OF THE INVENTION

1. Field of the Invention

The present invention relates generally to methods and apparatus for testing integrated circuits, and more particularly to advanced probe cards and methods of fabricating the same.

2. Description of the Background Art

Probe cards are used in the testing of integrated circuits (ICs) by providing an interface between the pads of a bare die or chip formed on a wafer or substrate and test equipment.

One conventional type of probe card uses a large number of cantilevered arms extending obliquely outwardly from the planar surface of a substrate or a printed circuit board (PCB). Probe pins having needle-like tips extend from distal ends of the cantilevered arms to provide electrical contact with the pads on the die. The probe pins or the tips are typically made of a hard material, such as tungsten, to extend the operating life of the probe card. When the wafer is raised beyond the point at which the first pads on the die first come into contact with these tips, the arms flex so as to allow remaining tips on other arms to contact pads on the die, thereby compensating for any small variations in planarity or parallelism between the probe card and die or chip on the surface of the wafer. In addition, movement of the wafer past the point at which the tips contact pads on the die and the resultant flexing of the cantilever arms cause the tips to scrub across their respective pads thereby removing oxide buildup on the pads, and improving electrical contact between the probe card and the die.

One disadvantage of the above conventional approach is that the hardness of the tips of the probe pins and the typically limited movement of the cantilever arms can compensate for only small variations in planarity or parallelism between the surface of the die and the probe card. Moreover, even under ideal circumstances, the wafer typically receives some damage from the probe tip touch down. Thus, if the probe card is pushed against the wafer with a greater than usual force, such as to compensate for non-planarity or lack of parallelism, there is substantial likelihood that the wafer will be destroyed.

Another commonly used type of conventional probe card uses micro spring probes eliminating the need for cantilevered arms, and reducing if not eliminating damage to the wafer from solid tungsten probe pins. However, most spring probes have inherent limitations, such as limited pitch and limited pin count due to the size of the springs. More fundamentally, micro-spring probe cards have a substantially higher cost of fabrication than conventional cantilever probe cards.

Other additional disadvantages of both types of conventional probe cards include high cost, since a new or reconfigured probe card must be produced for each new IC layout, and long lead times required to produce a new or reconfigured probe card resulting in delays in chip production. This last problem arises because the layout or configuration of the probe card generally cannot be determined until the final mask for the IC is produced. Thus, availability of a probe card to test an IC can lag the initial production of the IC by four weeks or more.

Accordingly, there is a need for a probe card and a method using the same that are capable of compensating for significant variations in planarity or parallelism between the wafer and the probe card, without increasing the possibility of damage to the wafer. It is desirable that the probe card has a low cost relative to conventional advanced or high pin count probe cards. It is further desirable that new probe cards having a new configuration can be manufactured quickly, to reduce if not eliminate impact on chip production.

SUMMARY OF THE INVENTION

In one aspect, the present invention is directed to a probe card for testing a number of dice under test (DUTs) on a wafer. Generally, the probe card includes a substrate, a number of electrically conducting cantilevers formed on a surface of the substrate, and a number of electrically conducting probes extending from unsupported ends of the cantilevers. The unsupported end of each of the cantilevers projects over one of a number of cavities formed in the surface of the substrate. Each of the probes having a tip adapted for contacting a pad on a surface of the DUT. Preferably, the probes include a pin made of a first material and having a first cross-sectional area, and the tip is made of a second material and having a second cross-sectional area smaller than the first cross-sectional area.

In one embodiment, the probe card further includes an electrically insulating compressive layer, such as an interposer, disposed above the surface of the substrate, the compressive layer having a number of holes extending therethrough and through which the probes extend to contact the pads on the surface of the DUT. Preferably, the compressive layer has a thickness of equal to or less than 300 microns. More preferably, the compressive layer includes polyimide, and wherein the compressive layer further includes a thin nitride capping layer on a top surface thereof.

In another embodiment, the substrate includes an anti-wafer having a number of electrically conducting interconnects formed therein for electrically coupling the probes through cantilevers to a number of test circuits. The substrate can further include a gasket abutting a backside surface of the anti-wafer and a plate of a test apparatus in which the probe card is held, to adjust for non-coplanarity between the surface of the substrate and the surface of the DUT. In one version of this embodiment, at least one of the test circuits is formed in the anti-wafer. In another version of this embodiment, the anti-wafer is divided into a number of probe dice, and each of the probe dice include at least one cantilever projecting over a cavity formed in the surface of the probe dice, and a probe extending from the unsupported end of the cantilever. The cavity may be left empty or filled with a compressive material, for example. Preferably, the probe dice are separated from one another by a number of intersecting recesses or grooves. More preferably, the cantilevers are electrically coupled to the test circuits through the interconnects in the anti-wafer and electrical contacts formed in the intersecting recesses.

In another aspect, the invention is directed to a method of fabricating a probe card such as those described above.

BRIEF DESCRIPTION OF THE DRAWINGS

These and various other features and advantages of the present invention will be apparent upon reading of the following detailed description in conjunction with the accompanying drawings and the appended claims provided below, where:

FIG. 3 is schematic planar view of an anti-wafer having a plurality of probe dice according to an embodiment of the present invention;

FIG. 4 is schematic planar view of a portion of the anti-wafer of FIG. 3 showing probe dice with criss-cross recesses therebetween according to an embodiment of the present invention;

FIG. 5 is schematic cross-sectional view of a portion of the probe dice of FIG. 4 showing the recess formed between adjacent probe dice according to an embodiment of the present invention.

The figures are not drawn to scale.

DETAILED DESCRIPTION

The present invention is directed to a probe card, and to methods of manufacturing and using the same for testing integrated circuits (ICs) formed in dice of a wafer or semiconductor substrate.

A probe card according to an embodiment of the present invention will now be described in greater detail with reference to FIGS. 1 to 6. For purposes of clarity, many of the details of testing semiconductor devices or ICs in general, and probe cards in particular, that are widely known and are not relevant to the present invention have been omitted from the following description. Probe cards and IC testing are described in, for example, commonly assigned U.S. Pat. Nos. 6,847,218 and 6,759,865, which are incorporated herein by reference in their entirety.

Figure 1:
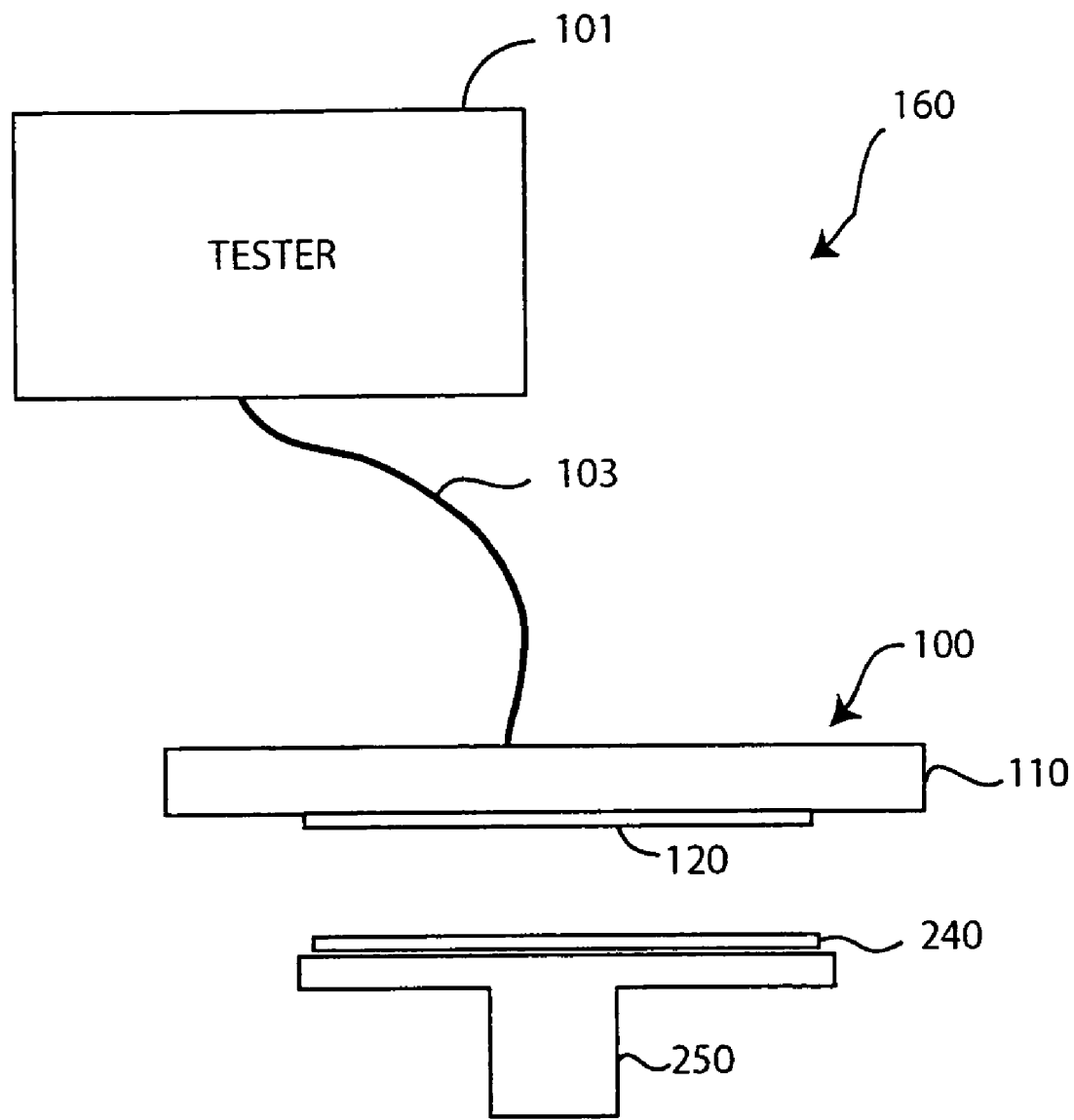
FIG. 1 is a schematic block diagram of a test environment according to an embodiment of the present invention.

FIG. 1 is a schematic block diagram of a test environment 160 in accordance with an embodiment of the present invention. In the example of FIG. 1, the test environment 160 includes a tester 101 and a prober 100. The tester 101 may be a commercially available test equipment product such as those of the type available from Advantest Corporation, for example. The tester 101 is electrically coupled to the prober 100 using a cable 103. The prober 100 may include a probe card 110, which in turn may include an anti wafer 120. As will be more apparent below, the anti-wafer 120 provides a removable electrical connection to a wafer 240. The wafer 240 includes a plurality dice, each die having one or more devices under test (DUTs). The wafer 240 may be supported by a probe chuck 250, which may be of the type similar to those available from the Electroglas company. During a test run, the anti-wafer 120, the wafer 240, or both are positioned such that one or more probes on the anti-wafer 120 touch contact points on the wafer 240. This allows the tester 101 to send stimulus signals to the wafer 240 via a path that includes the cable 103, the probe card 110, and the anti-wafer 120. Similarly, the tester 101 may receive response signals from the wafer 240 over the same path.

Figure 2:
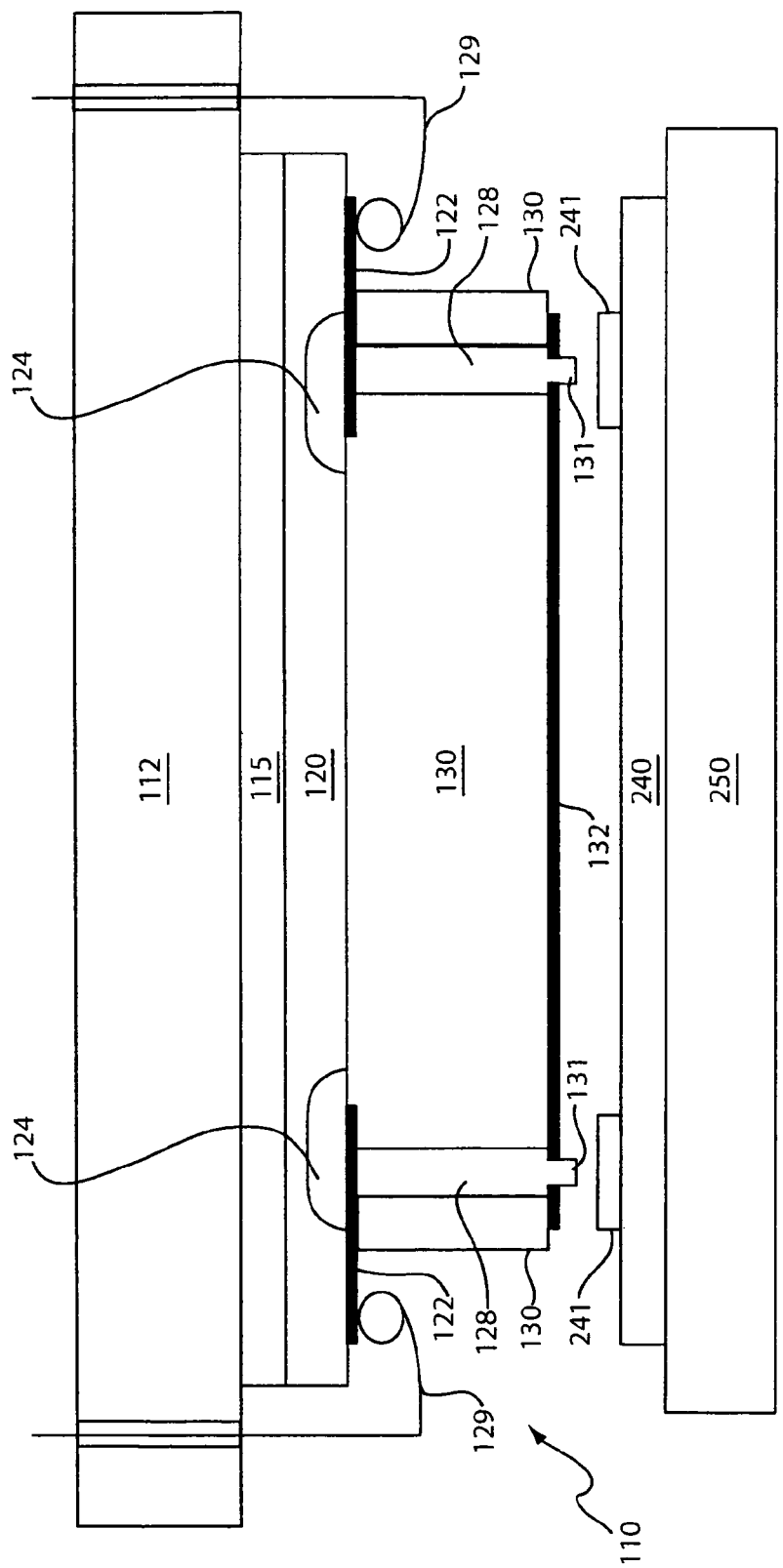
FIG. 2 is a schematic block diagram of wafer positioned on a chuck in a test environment according to an embodiment of the present invention.

FIG. 2 is a schematic block diagram of the wafer 240 positioned on the chuck 250 in a test environment according to an embodiment of the present invention. Spaced apart from the wafer 240 and facing in opposition thereto is the probe card 110. In the example of FIG. 2, the probe card 110 includes a base 112, a gasket 115, an anti-wafer 120, and an isolation layer 130.

The base 112 may comprise a ceramic plate or a printed circuit board (PCB), for example. Electrical connections from the tester 101 (see FIG. 1) may be terminated on the base 112. For example, the cable 103 may have a connector that connects to a matching terminal on the base 112. Electrical connections between the base 112 and the anti-wafer 120 may be made by way of wirings 129. In the example of FIG. 2, the wirings 129 electrically contact the anti-wafer 120 using solder balls formed on electrically conductive cantilevers 122.

A number of electrically conducting cantilevers 122 may be formed on the anti-wafer 120. In the example of FIG. 2, a number of electrically conducting probes 128 extend from unsupported ends of the cantilevers 122. The cantilevers 122 may include, for example, a single homogenous layer of a material that is both flexible and conductive, or a bi-layer structure including a metal layer, such as aluminum (Al), deposited over a mechanical layer of a tractable or flexible dielectric material, such as an oxide or a nitride. The probes 128 may include a pin (i.e., main body) comprising a first metal and having a first cross-sectional area, and a tip 131 comprising a second metal and having a second cross-sectional area smaller than the first cross-sectional area. Preferably, the pin of a probe 128 comprises copper, nickel, or alloys thereof, while its tip 131 comprises nickel, gold or alloys thereof. Both the cantilevers 122 and the probes 128 may be formed using standard deposition, photolithographic, and etching techniques widely known and used in semiconductor processing and microelectromechanical systems (MEMs) fabrication. As will be further discussed below, the anti-wafer 120 may be divided into a plurality of probe dice, with each probe die having one or more probes 128, cantilevers 122, and cavities 124. Each probe die may be used to test a corresponding die on the wafer 240.

The unsupported end of each of the cantilevers 122 projects over one of a number of cavities 124 formed on the surface of the anti-wafer 120. The cavities 124 advantageously enable the unsupported ends of the cantilevers 122 to flex or deform downward under force applied to the probe card 110 and/or the wafer 240 ("wafer under test"), thereby compensating for much greater variations in planarity of the probe card or the wafer 240, and/or differences in parallelism between the probe card 110 and the wafer 240, than possible in conventional cantilever probe cards. A single cavity 124 may have a depth sufficient to enable free movement of a cantilever 122, or may have a cross-sectional surface area tailored to accommodate more than one cantilever 122. Optionally, the cavities 124 may extend substantially entirely through the anti-wafer 120, and may be formed through the backside of the anti-wafer 120. Optionally, the cavities 124 may be filled with a compressive material, such as polyimide.

A compressive layer, such as an electrically insulating interposer 130, may be formed on or disposed above the surface of the anti-wafer 120 with a number of holes through which the probes 128 extend. Preferably, the interposer 130 comprises an elastomer capable of flexing or compressing under force or pressure, thereby further compensating for variations in planarity or parallelism. In one embodiment, the interposer 130 comprises a layer of polyimide, having a thickness equal to or less than about 300 microns (μm). A relatively thin capping layer 132 may be formed on the surface of the interposer 130 facing the wafer 240 to protect the interposer during formation of holes therein. The capping layer 132 may comprise silicon nitride, for example.

The anti-wafer 120 is so named because it may comprise a semiconductor substrate or a wafer having a silicon on insulator (SOI) layer with a number of contact points (e.g., probes 128 or pads) formed thereon, the layout of the contact points corresponding to a layout of pads 241 on the wafer 240 under test. The pads 241, which may be on dice on the wafer 240, are electrically connected to circuits of devices being tested. During testing, a probe 128 contacts a corresponding pad 241, thereby forming an electrical connection between the wafer 240 and the probe card 110. The probe card 110 includes a number of electrically conducting wirings 129 for electrically coupling the probes 128 through cantilevers 122 to a number of test circuits in the tester 101.

Because the anti-wafer 120 may comprise a semiconductor substrate, one or more test circuits may be formed in the anti-wafer 120, thereby off-loading some or all of the testing functions from the tester 101, enabling more rapid testing and the use of less complex and therefore less expensive testers. Preferably, where the anti-wafer 120 has a configuration, architecture or topology designed for use with a specific integrated circuit or device under test, the test circuit formed in the anti-wafer 120 may be designed or optimized to test that specific integrated circuit or device under test.

As shown in FIG. 2, the anti-wafer 120 may further include a gasket 115. The gasket 115 may abut a backside surface of the anti-wafer and the base 112 to further increase co-planarity between the surface of the anti-wafer 120 and the surface of the wafer 240 being tested.

Referring now to FIG. 3, there is shown a schematic planar view of an anti-wafer 120 having a plurality of probe dice 121 according to an embodiment of the present invention. Note that only some of the probe dice 121 are labeled in the interest of clarity. A probe die 121 may have a probe layout that matches contact points on a corresponding die on the wafer 240. As can be appreciated, the probe layout of a probe die 121 may be personalized for a particular die on the wafer 240 being tested. Each probe die 121 may have at least one cantilever 122 projecting over a cavity 124 formed on the surface thereof, and a probe 128 extending from the unsupported end of the cantilever 122 (see FIG. 2). Preferably, the probe dice are separated from one another by a number of intersecting grooves or recesses 123. As shown in FIG. 3, the recesses 123 can be arranged on the surface of the anti-wafer 120 to create a crisscross pattern. The recesses 123 can be formed on the anti-wafer 120 using semiconductor processing or MEMs fabrication techniques. A process for forming these recesses is further described below.

FIGS. 4 and 5 show further details of the probe dice 121 and the recesses 123. In particular, FIG. 4 is schematic planar view of a portion of the anti-wafer 120 of FIG. 3 showing four of the probe dice 121 with crisscrossed recesses 123 therebetween. FIG. 5 is schematic cross-sectional view taken along sections A-A of FIG. 4. FIG. 5 shows a portion of two adjacent probe dice 121 and a recess 123 formed between them according to an embodiment of the present invention. As will be more apparent below, a recess 123 advantageously accommodates a wiring 129 or other electrical interconnection to a probe die 121 to prevent scratching the surface of a wafer being tested.

A method of fabricating a probe card in accordance with an embodiment of the present invention will now be described with reference to FIGS. 6(a)-6(e). Generally, the method involves: (i) forming a pattern of intersecting recesses or grooves on the surface of a substrate; (ii) depositing a conformal conductive layer over the patterned surface of the substrate; (iii) patterning the conductive layer to form one or more beams, which will be further processed to form one or more cantilever structures on raised portions on the surface of the substrate and a number of contacts or pads on which the contacts will subsequently be formed in the recesses; (iii) depositing an electrically insulating material on the raised portions on the surface of the substrate to form a number of electrically insulating compressive layers; (iv) forming a number of openings extending through the electrically insulating material from a top surface thereof, each of the openings intersecting with and exposing a portion of one of the beams formed in the patterned conducting layer; (v) filling each of the openings with an electrically conductive material to form a number of electrically conducting probes extending from the exposed portions of the beams; (vi) forming a number of etch release holes extending from a top surface of each electrically insulating compressive layers and terminating on and exposing a portion of the substrate surface adjacent to one of the beams formed thereon; and (vii) etching or removing a portion of the substrate surface adjacent to the beams to release the beams, thereby forming a number of cantilevers, each having an unsupported end projecting over a cavity formed in the surface of the substrate.

Figure 6A:
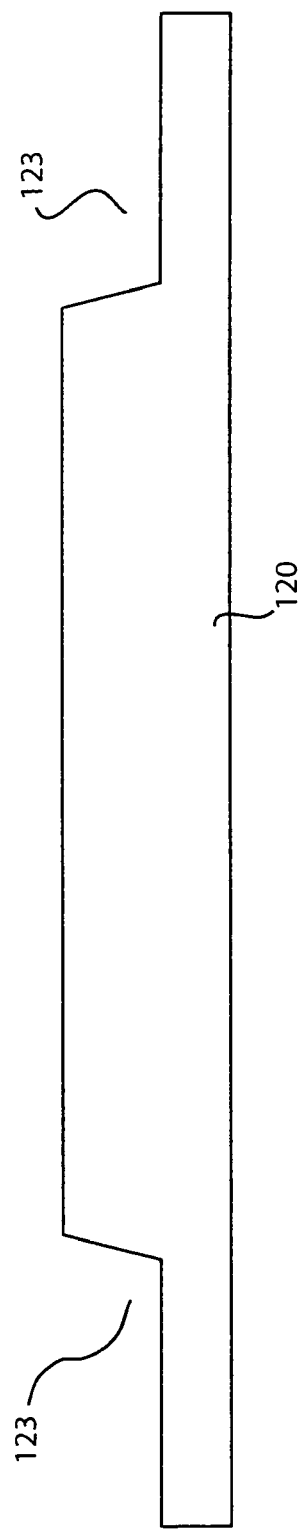
FIGS. 6(a)-6(e) schematically illustrate the fabrication of a probe card according to an embodiment of the present invention.

In FIG. 6(a), a pattern of crisscrossed recesses 123 is formed on the surface of an anti-wafer 120. In the example of FIG. 6(a), the anti-wafer 120 comprises a silicon substrate. In one embodiment, the step of forming a pattern of intersecting recesses or grooves on the surface of the substrate includes the step of forming a grid of recesses 123, as shown in FIGS. 3-5, on a single crystal silicon substrate using a KOH etch process.

Figure 6B:
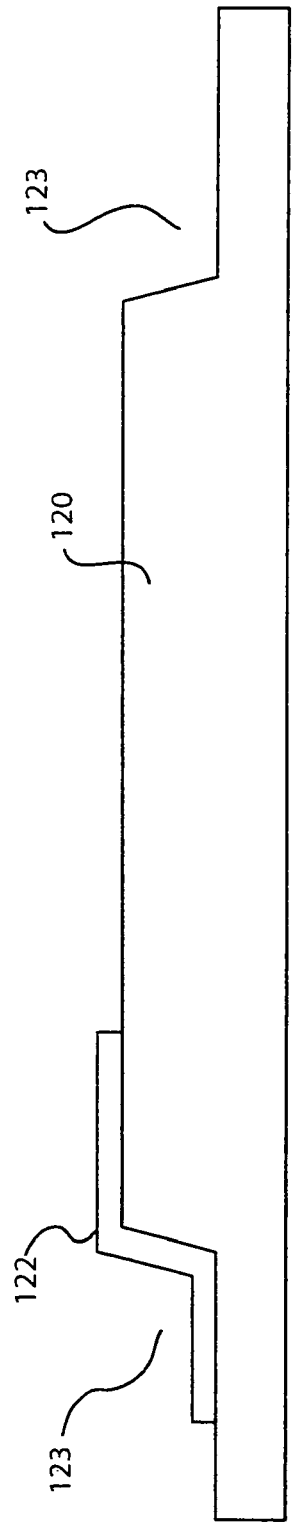

In FIG. 6(b), a conformal conductive layer is deposited on the sample of FIG. 6(a), and then patterned to form one or more structures that will be become cantilevers 122. The step of depositing a conformal conductive layer can involve depositing a single layer of metal, such as Aluminum, or a bi-layer of an upper conductive material and second nonconductive layer having the desired mechanical properties, i.e., strength and flexibility. For example, the conformal conductive layer can include an Al layer over a Silicon Oxide (SiO2) layer. The step of patterning the conductive layer to form one or more structures (and contacts or pads in the recesses), can be accomplished using standard and known photolithographic processes. In one embodiment, this step involves electro-deposition (ED) of photoresist to provide a substantially uniform PR mask over the surface with the recesses or grooves formed therein. Etching of the conductive layer can then be performed using any standard technique having a suitable selectivity to the substrate.

Figure 6C:
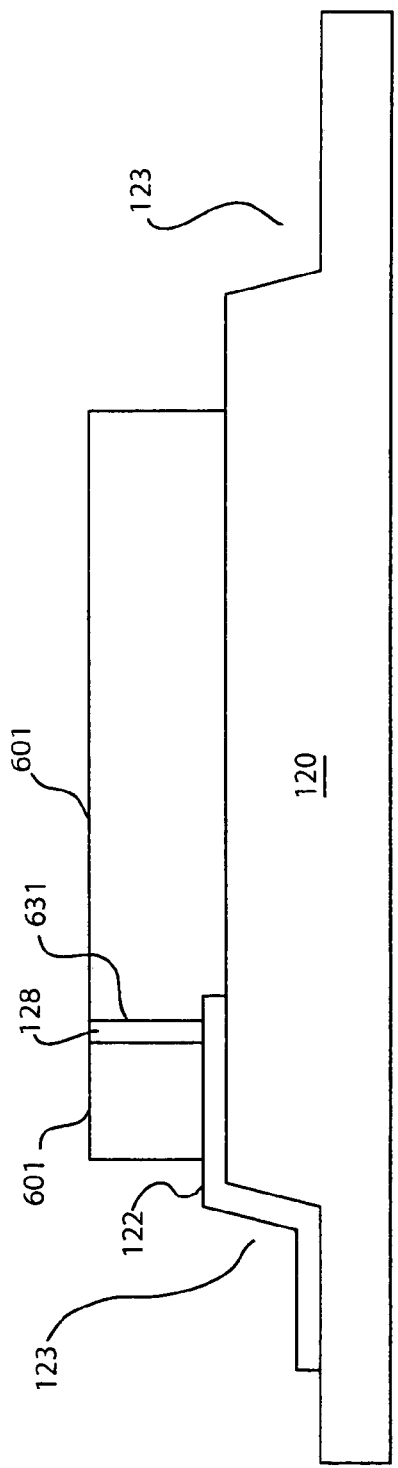

In FIG. 6(c), an electrically insulating material is deposited on raised (i.e., not on recesses 123) portions of the anti-wafer 120 to form a number of electrically insulating compressive layers, such as interposers 601. In one embodiment, the step of depositing an electrically insulating compressive layer on the raised portions on the surface of the anti-wafer 120 comprises depositing a flexible or tractable resilient material such as polyimide. One or more openings 631 are then formed through the interposers 601. Each opening 631 extends from the top of the interposer 601 and intersect with and exposes what would become an unsupported end of a cantilever 122. The openings 631 are then filled with an electrically conductive material to form one or more probes 128 extending from the exposed beam portions of the cantilevers 122. Preferably, the step of filling each of the openings 631 includes filing the openings 631 with a copper (Cu) and nickel (Ni) alloy to form the probes 128.

Figure 6D:
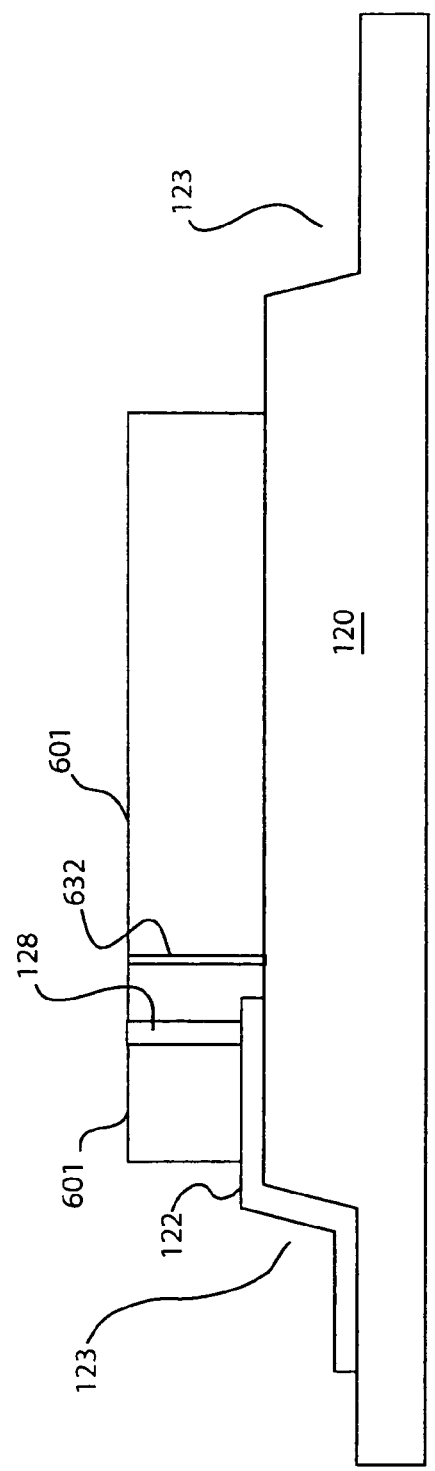

In FIG. 6(d), a number of etch release holes 632 are formed through the interposers 601. Each release hole 632 extends from the top of the interposer 601 and ends on a surface of the anti-wafer 120 where a cavity 124 (see FIG. 6(e)) will be formed under the unsupported end of a cantilever 122. Note that the etch release hole 632 shown in FIG. 6(d) is not to scale and is generally a lot smaller than that for the probe 128. It is to be further noted that only one etch release hole 632 is shown in FIG. 6(d) for clarity of illustration. The step of forming a number of etch release holes 632 generally includes forming a sufficient number of holes having a sufficient cross-sectional area to completely release the unsupported end of the cantilevers, without unduly weakening the substrate or causing one cavity to open to another.

Figure 6E:
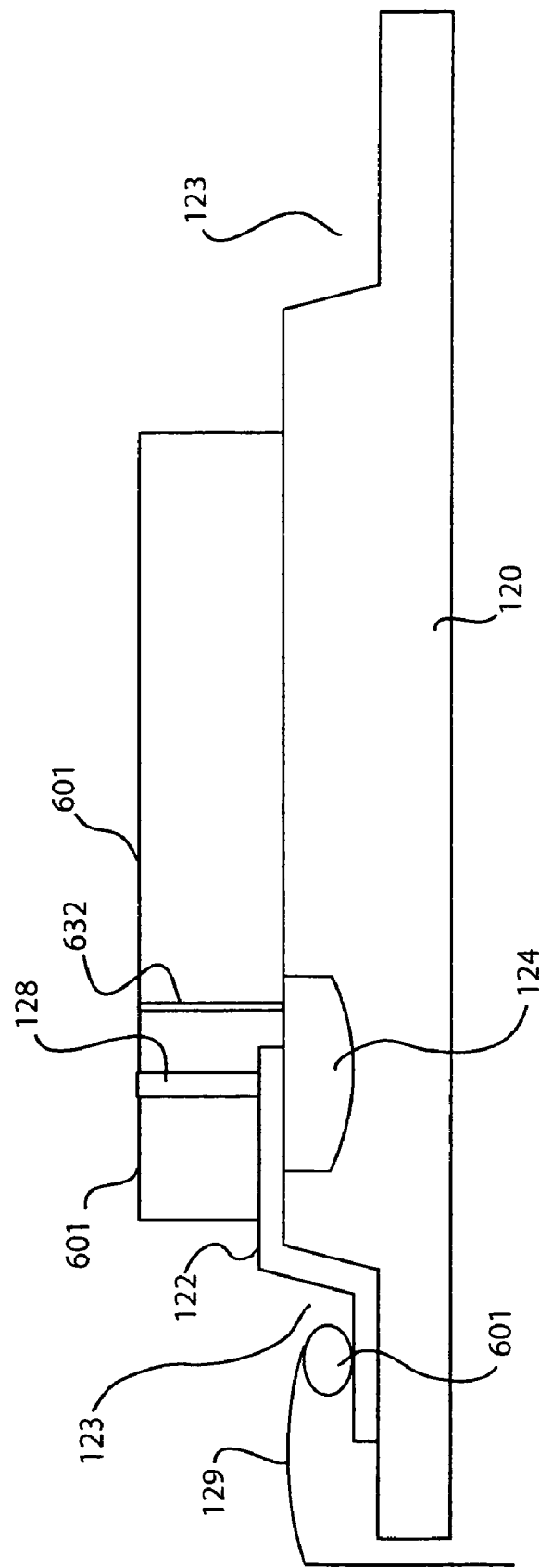

In FIG. 6(e), one or more cavities 124 are formed on the surface of the anti-wafer 120. Each cavity 124 allows an unsupported portion of a cantilever 122 to flex when a probe 128 is pushed in a direction towards the cavity 124. The cavities 124 may be formed by etching or removing a portion of the surface of the anti-wafer 120 adjacent to the ends of the cantilevers 122. In one embodiment, the unsupported portions of cantilevers 122 are released by etching or removing the desired portions of the anti-wafer 120 using a xenon difluoride (XeF2) etch process. According to one embodiment of the invention, the sample of FIG. 6(d) is placed in a first chamber or vessel that is purged, typically with nitrogen, and evacuated down to a moderate vacuum. The $XeF_2$ is sublimated in a separate container or vessel to a pressure of about 4 mTorr (the vapor pressure of $XeF_2$), and then introduced into the first chamber. Preferably, the $XeF_2$ release or etching process is performed in vapor phase at a pressure of 60 mTorr, at room temperature and with no external energy sources. Under these conditions, a highly selective and isotropic etch of silicon has been observed with rates as high as 10 microns per minute. The $XeF_2$ release process is allowed to proceed without etching any of the cantilever or interposer material until substantially all of the unsupported ends of the cantilevers 122 are released and the cavities 124 having the desired dimensions are formed.

Still referring to FIG. 6(e), a wiring 129 may be electrically coupled to a cantilever 122. In the example of FIG. 6(e), the wiring 129 is electrically coupled to the cantilever 122 using a solder ball 601. Placement of the solder ball 601 and the wiring 129 in the recesses 123 below the raised surface of the anti-wafer 120 advantageously minimizes or avoids entirely possible damage to the wafer under test due to scrubbing of the wafer under test with a connector, and enables use of a thinner interposer 601.

The sample of FIG. 6(e) may be further processed by capping the interposers 601 with a silicon nitride layer, and/or forming Ni/Gold (Au) tips on the probes 128.

The advantages of the probe card of the present invention over previous or conventional techniques include: (i) reduction in costs of probe cards; (ii) reduction in manufacturing time for new probe cards having new configurations to test new product wafers; and (iii) ability to offload a number of functions to on board test circuitry in the anti-wafer of the probe card, thereby enabling low cost testers to be utilized.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method of fabricating a probe card, the method comprising:
   forming a plurality of electrically conducting cantilevers on a surface of a substrate, each of the cantilevers having an unsupported end projecting over one of an equal number of cavities formed on the surface of the substrate;
   forming a plurality of electrically conducting probes extending from the unsupported ends of the cantilevers, each of the probes having a tip for contacting a pad on a surface of a device under test (DUT); and
   forming an electrically insulating compressive layer above the surface of the substrate, the compressive layer having a plurality of holes extending therethrough and through which the probes extend to contact pads on the surface of the DUT.

2. The method of claim 1, wherein the compressive layer is formed to a thickness equal to or less than about 300 microns.

3. The method of claim 1 wherein the compressive layer comprises polyimide and a nitride capping layer.

4. The method of claim 1 wherein each of the probes comprises a body made of a first material and having a first cross-sectional area, and a tip made of a second material and having a second cross-sectional area, and wherein the second cross-sectional area is smaller than the first cross-sectional area.

5. The method of claim 1 wherein the substrate comprises an anti-wafer having a plurality of electrically conducting wirings formed thereon for electrically coupling the probes through the electrically conductive cantilevers to a test circuit.

6. The method of claim 5 wherein the test circuit is formed in the anti-wafer.

7. The method of claim 5 wherein the substrate further comprises a gasket abutting a backside surface of the anti-wafer to increase co-planarity between the surface of the substrate and the surface of the DUT.

8. The method of claim 5 wherein the anti-wafer is divided into a plurality of probe dice, and wherein each of the probe die comprises at least one conducting cantilever projecting over a cavity formed on the surface of the probe die, and an electrically conducting probe extending from the unsupported end of the cantilever to contact a pad on a surface of a DUT on the wafer.

9. The method of claim 8 wherein the plurality of probe dice are separated from one another by a plurality of intersecting recesses, and wherein wirings to the anti-wafer are formed in the plurality of intersecting recesses to prevent scratching the wafer.

* * * * *